United States Patent [19]
Alvis et al.

[11] Patent Number: 5,536,940
[45] Date of Patent: Jul. 16, 1996

[54] ENERGY FILTERING FOR ELECTRON BACK-SCATTERED DIFFRACTION PATTERNS

[75] Inventors: Roger L. Alvis, Cupertino, Calif.; David J. Dingley, Salt Lake City, Utah

[73] Assignee: Advanced Micro Devices, Inc., Sunnyvale, Calif.

[21] Appl. No.: 394,852

[22] Filed: Feb. 27, 1995

[51] Int. Cl.$^6$ .............................. H01J 37/05; H01J 37/29
[52] U.S. Cl. .......................... 250/310; 250/307; 250/305
[58] Field of Search .................................... 250/306, 310, 250/311, 305, 397

[56] References Cited

U.S. PATENT DOCUMENTS

| | | | |
|---|---|---|---|
| 3,582,649 | 6/1971 | Taylor | 250/305 |
| 4,179,604 | 12/1979 | Christon et al. | 250/310 |
| 4,559,450 | 12/1985 | Robinson et al. | 250/310 |
| 4,896,045 | 1/1990 | Okunuki et al. | 250/310 |
| 5,093,573 | 3/1992 | Mikoshiba et al. | 250/310 |
| 5,264,704 | 11/1993 | Phang et al. | 250/310 |

OTHER PUBLICATIONS

James F. Mancuso et al., "Effect of Energy Filtering on Micro–Diffraction in the SEM", Proceedings Fifty–Second Annual Meeting Microscopy Society of America Twenty–Ninth Annual Meeting Microbeam Analysis Society, 31 Jul.–5 Aug. 1994, San Francisco Press, Inc.

L. Reimer, "Energy–Filtering Transmission Electron Microscopy in Materials and Life Science", Prodeedings Fifty–Second Annual Meeting Microscopy Society of America Twenty–Ninth Annual Meeting Microbeam Analysis Society, 31 Jul.–5 Aug. 1994, San Francisco Press, Inc.

*Primary Examiner*—Bruce C. Anderson
*Attorney, Agent, or Firm*—Skjerven, Morrill, MacPherson, Franklin & Friel; Paul J. Winters

[57] ABSTRACT

A sample to be analyzed by a scanning electron microscope is held at an electrostatic potential higher than the recording plate of the microscope. This provides that electrons scattered from the sample which are at an energy level lower than a chosen level are drawn back into the sample by the potential of the sample, while other, higher energy scattered electrons reach the recording plate to form a pattern thereon.

11 Claims, 2 Drawing Sheets

ENERGY FILTERING FOR ELECTRON BACK-SCATTERED DIFFRACTION PATTERNS

FIELD OF THE INVENTION

This invention relates to materials characterization, and more particularly, to the characterization of material by means of back scattered electron diffraction.

BACKGROUND OF THE INVENTION

A typical prior art apparatus for scanning electron microscopy is shown in FIG. 1. As shown therein, a sample 10 to be analyzed is fixed to a platen 12 inside a chamber 14 of a scanning electron microscope. The microscope emits a plurality of electrons 16 toward the sample 10, each at for example energy $E_0$ electron volts. The platen 12 is in turn fixed to the body of the microscope, which is at ground potential, so that the platen 12 and sample 10 are nominally at ground potential.

Of the electrons which contact the sample 10, a number thereof scatter from the sample 10 with complete elasticity, i.e., each such electron maintains the energy $E_0$ electron volts. The remaining electrons from the incident beam are inelastically scattered from the sample into continuum of energies, from 0 electron volts up to $E_0$ electron volts, one for example being shown with an energy of $E_0 - \Delta E$ electron volts.

A phosphorus recording plate 18 is included within the chamber 14, also being held at ground potential, and as is well known, a diffraction pattern is defined on the recording plate 18 by the elastically scattered electrons reaching the plate 18 so that information about the crystallography of the sample 10 can be obtained. It is important to note that inelastically scattered electrons do not contribute to the desired diffraction pattern signal, but in fact obscure such a pattern by raising the level of background noise.

As pointed out in the article "Effect of Energy Filtering on Micro-Diffraction in the SEM", by James F. Mancuso et al., Proceedings Fifty-Second Annual Meeting Microscopy Society of America Twenty-Ninth Annual Meeting Microbeam Analysis Society, 31 Jul. 5 Aug. 1994, San Francisco Press, Inc., it is well known that providing an electron energy filter between the sample 10 and the recording plate 18 can decrease the background noise increasing the diffraction pattern visibility. The above-cited article describes various experiments aimed toward achieving this goal. The filter typically takes the form of a grid positioned between the sample 10 and the recording plate 18 and carrying a large negative electrostatic potential so as to repel electrons of lower energy, thus allowing only electrons with sufficient energy to pass through the filtering medium. As is well known, having the recording plate 18 very close to the sample 10 is necessary to insure that the recording plate 18 receives a large solid angle of electrons scattered from the sample 10, so that the recording plate 18 receives a substantial amount of information concerning the sample 10. It will be seen that this advantage is somewhat negated if a filter is placed between the sample 10 and the recording plate 18, forcing the sample 10 and recording plate 18 to be moved further apart.

Also, with the filter positioned between the sample 10 and recording plate 18, the field of view is blocked to an extent by the filter.

Also of general interest is the article "Energy-Filtering Transmission Electron Microscopy in Materials and Life Science", by L. Reimer, Proceedings Fifty-Second Annual Meeting Microscopy Society of America Twenty-Ninth Annual Meeting Microbeam Analysis Society, 31 Jul.-5 Aug. 1994, San Francisco Press, Inc.

SUMMARY OF THE INVENTION

The present invention provides for holding the sample at an electrostatic potential higher than the recording plate. This provides that electrons scattered from the sample which are at an energy level lower than a chosen level are drawn back into the sample by the potential of the sample. The potential of the sample can be varied relative to that of the recording plate so that the threshold at which electrons are drawn back into the sample can be varied. The use of a filter or other hardware between the sample and recording plate is avoided, the signal-to-noise ratio is improved, and there is no blocking of the microscope field of view.

DESCRIPTION OF THE PREFERRED EMBODIMENTS

Figure 1:
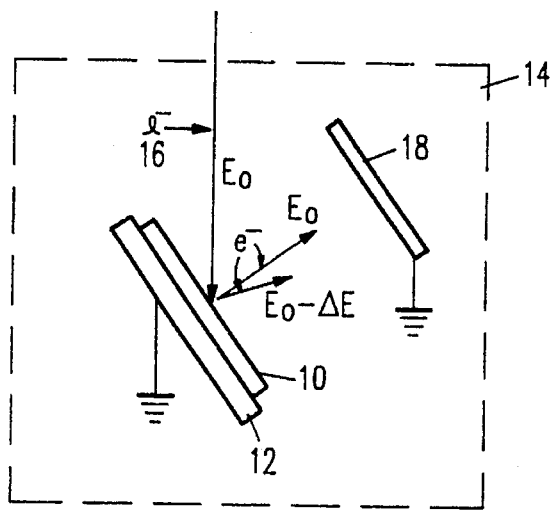
FIG. 1 is a side view of a typical prior art scanning electron microscope image recording apparatus.
Figure 2:
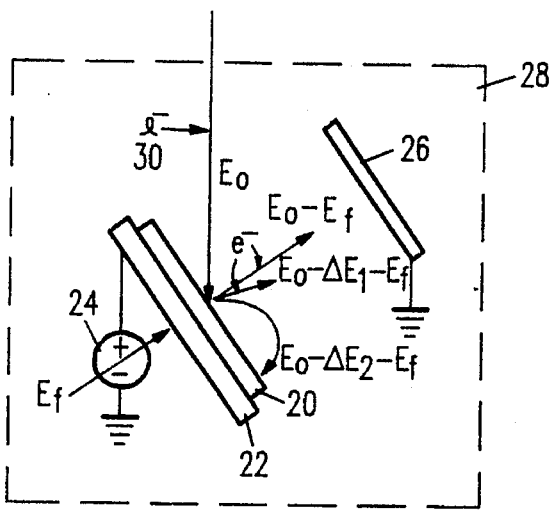
FIG. 2 is a view similar to that shown in FIG. 1 but showing the present invention.

With reference to FIG. 2, a sample 20 to be imaged is mounted on a platen 22 and is held at a potential $E_f$ electron volts by variable voltage source 24, while the phosphorus recording plate 26 is held at ground, all within the chamber 28 of a scanning electron microscope. Electrons 30 at the incident energy $E_0$ electron volts are forced to impinge on the sample 20, from which they are scattered. Those electrons which are elastically scattered leave the sample 20 at energy $E_0 - E_f$ electron volts as they travel toward the recording plate. Only electrons which are scattered, elastically or inelastically, from the sample 20 with energy greater than $E_f$ electron volts will reach the recording plate 26 and not be drawn back to the sample 20. Electrons which are inelastically scattered from the sample 20, at for example energy level $E_f$ electron volts and below will be drawn back to the sample.

It will be seen that a diffraction pattern will indeed be established on the recording plate 26, but with enough low energy electrons being pulled back into the sample 20 to improve the signal to noise ratio. The level $E_f$ can be adjusted to achieve the desired signal to noise ratio.

It will be seen that in this embodiment, the field of view of the microscope is not obstructed by any hardware, allowing the recording plate 26 to be quite close to the sample, providing a large solid angle of acceptance for the recording medium.

Figure 3:
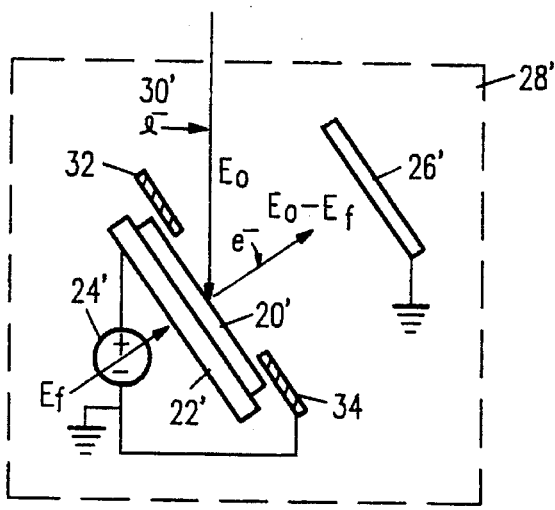
FIG. 3 is a view similar to that shown in FIG. 2 showing another embodiment of the present invention.

FIG. 3 shows an embodiment similar to that shown in FIG. 2, but with an annular grid 32 disposed generally between the sample 20' and recording plate 26' and held at ground potential. The annular grid 32 defines an opening 34 through which scattered electrons may pass from the sample 20' to the recording plate 26' at the same solid angle as in the embodiment without the grid. Note that the annular grid is not biased with respect to the sample, thus it is not in effect an energy filter but merely a means to minimize distortion in the resulting diffraction pattern. This grid 32 collects stray electric lines which might cause aberrations in the image on the recording plate 26'.

The apparatus and method hereof have particular importance in characterizing metal structures for sub-half-micron processes in semiconductor technology. Of particular interest, for example, is the evaluation of aluminum film or lines wherein one wishes to measure the texture of the grain size thereof. Typically, such a film or line 40 is not directly connected to the substrate 42, but is insulated therefrom by an oxide layer 44 (FIG. 4), so that the potential of the film or line 40 is floating with regard to the substrate 42. As pointed out above, it is desirable to maintain the substrate 42, and the aluminum film or line 40, at a potential $E_f$. A way to deal with this problem in the case of a film is to provide a small amount of conductive paste 46 such as carbon paint or silver paint to provide a connection between the substrate 42 and aluminum film, so that they will be at the same potential. Another way to approach this problem is to use a focused ion beam mill to drill a hole in the film or line 40' through the oxide 44' to the substrate 42' and to fill the hole with for example platinum 50 so that the film or line 40' and substrate 42' are at the same potential (FIG. 5).

Figure 4:
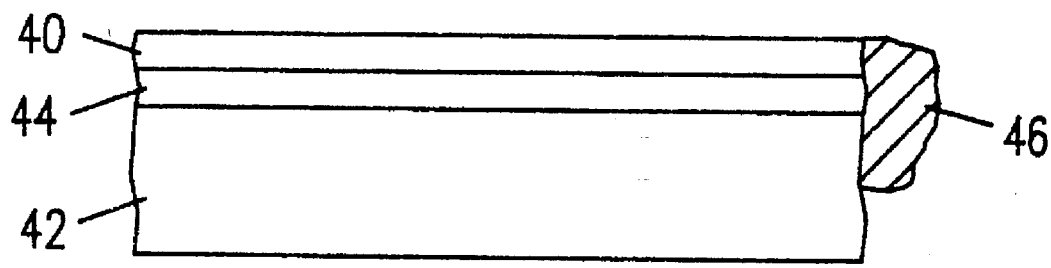
FIG. 4 is a cross-sectional view showing a particular sample for use with the present system.
Figure 5:
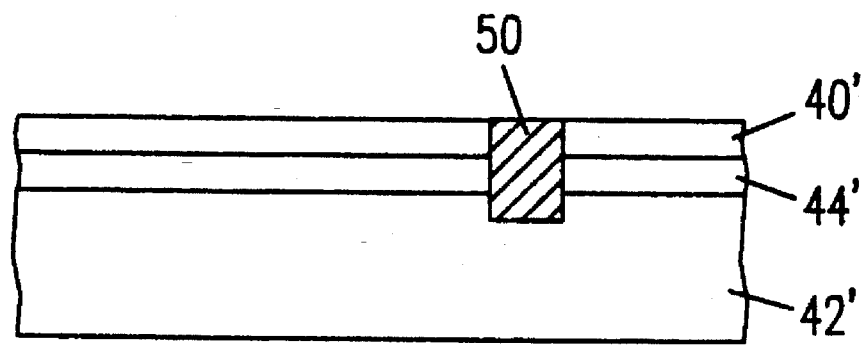
FIG. 5 is a cross-sectional view of another sample for use with the present system.

Such embodiments as shown in FIGS. 4 and 5 eliminate the problem of floating film or line charging problems.

Through the above description, it will readily be seen that the signal-to-noise ratio of the device is improved. The signal-to-noise ratio can be fine tuned by changing the potential applied to the sample to improve the contrast of the final image, with it being understood that eventually a controlling computer of the system could vary the potential to achieve a high quality image, and to store that potential value for further use.

We claim:

1. Apparatus for providing imaging of a sample, said apparatus comprising:

a source of electrons directed toward such a sample for scattering therefrom;

a recording plate for receiving at least some of the electrons scattered from such a sample;

wherein such a sample is at an electrostatic potential sufficiently greater than the electrostatic potential of the recording plate so that some of the electrons scattered from such a sample which would reach the recording plate in the absence of such a sufficiently greater electrostatic potential do not reach the recording plate.

2. The apparatus of claim 1 and further comprising means for selectively varying the electrostatic potential of such a sample.

3. The apparatus of claim 1 wherein the recording plate is held at ground potential.

4. The apparatus of claim 1 wherein electrons which do not reach the recording plate are pulled back into such a sample.

5. Apparatus for providing imaging of a sample, said apparatus comprising:

a source of electrons directed toward such a sample for scattering therefrom;

a recording plate for receiving at least some of the electrons scattered from such a sample;

wherein such a sample is at an electrostatic potential greater than the electrostatic potential of the recording plate;

and further comprising an annular grid positioned generally between such a sample and the recording plate, the grid defining an opening therethrough for allowing electrons scattered from such a sample to reach the recording plate.

6. The apparatus of claim 5 wherein the grid is held at the same electrostatic potential as the recording plate.

7. A method of providing imaging of a sample comprising:

directing a source of electrons toward the sample for scattering therefrom;

providing a recording plate for receiving electrons scattered from the sample; and providing that the sample is at an electrostatic potential sufficiently greater than the electric potential of the recording plate so that some of the electrons scattered from such a sample which would reach the recording plate in the absence of such a sufficiently greater electrostatic potential do not reach the recording plate.

8. The method of claim 7 are further comprising varying the electrostatic potential of said sample.

9. The method of claim 7 and further comprising the step of providing that electrons which do not reach the recording plate are pulled back into such a sample.

10. A method of providing imaging of a sample comprising:

directing a source of electrons toward the sample for scattering therefrom;

providing a recording plate for receiving electrons scattered from the sample; and providing that the sample is at an electrostatic potential greater than the electrostatic potential of the recording plate;

and further comprising providing an annular grid positioned generally between the sample and the recording plate, the grid having an opening therethrough for allowing passage of electrons from the sample to the recording plate.

11. The method of claim 10 and further providing that the grid is held at the same potential as the recording plate.

* * * * *